United States Patent

[11] 3,631,402

[72] Inventor Jack O. Field
West Carrollton, Ohio

[21] Appl. No. 21,150
[22] Filed Mar. 19, 1970
[45] Patented Dec. 28, 1971
[73] Assignee The National Cash Register Company
Dayton, Ohio

[54] INPUT AND OUTPUT CIRCUITRY
29 Claims, 3 Drawing Figs.

[52] U.S. Cl. .......................................................... 340/172.5, 307/221, 328/37
[51] Int. Cl. .......................................................... G06f 3/00
[50] Field of Search .......................................................... 340/172.5; 235/157; 328/37; 307/221

[56] References Cited

UNITED STATES PATENTS

| | | | |
|---|---|---|---|
| 3,440,613 | 4/1969 | Vercellotti | 340/172.5 |
| 3,374,467 | 3/1968 | Cast et al. | 340/172.5 |
| 3,395,400 | 7/1968 | De Witt et al. | 340/172.5 |
| 3,267,437 | 8/1966 | Harwood | 340/172.5 |
| 3,354,450 | 11/1967 | Carthew et al. | 340/172.5 |
| 3,413,610 | 11/1968 | Botjer et al. | 340/172.5 |
| 3,239,764 | 3/1966 | Verma et al. | 328/37 |

*Primary Examiner*—Raulfe B. Zache
*Assistant Examiner*—Mark Edward Nusbaum
*Attorneys*—Louis A. Kline, John J. Callahan and Harry W. Barron

ABSTRACT: Input and output circuitry is described which enables one to time share certain pads on an integrated circuit chip between several signals. This may be accomplished by providing shift registers for these pads and having each shift register receive, in parallel, the data bits provided by several of the logic circuits on the chip. Each shift register thereafter provides a signal which represents the data in serial order, and this signal is applied through the pad to a pad on a second chip. The signal is thereafter applied to a shift register on the second chip, and the data bits appear at its outputs in parallel. The data bits are thereafter applied to logic circuits on the second chip.

INVENTOR
JACK O. FIELD
BY Louis A. Kline
John J. Callahan
Harry W. Barron
HIS ATTORNEYS

INVENTOR
JACK O. FIELD
BY
HIS ATTORNEYS

INVENTOR
JACK O. FIELD
BY Louis A. Kline
John J. Callahan
Harry W. Barron
HIS ATTORNEYS

INPUT AND OUTPUT CIRCUITRY

This invention relates to input and output circuitry and more particularly to input and output circuitry for providing signals to and deriving signals from digital circuits which are built on an integrated circuit chip.

With the advent of the integrated circuits and more recently the techniques of large-scale integration, it has become possible to construct on a relatively small chip (e.g., 100 mils by 100 mils) many different digital circuits each of which can perform a certain logical operation during a given time. This is especially true where one uses metal oxide semiconductor (MOS) elements which are arranged in multiphased clocked digital circuits, such as four-phase switching circuits, for performing the logic operations. Although multiphase switching circuits may require more individual transistors, these transistors are very small (e.g., in the order of 0.4 mil by 0.4 mil), so that the total area of the circuit chip required for one digital circuit is less than that which was required for comparable circuits in single-phase switching operation.

Before one can fully utilize techniques of large-scale integration and multiphase switching circuits, it is necessary to have circuitry for applying the necessary input signals to the chip and for deriving the output signals provided by the circuitry on the chip. Typically, on a 100-mil-square integrated circuit chip of the prior art, one will find 40 input and output pads. Four of these pads will have to be used for clocking signals, while two others will have to be used for the voltage supply. Thus, 34 pads will remain on each integrated circuit chip, which may be used to apply digital information to the chip or to derive digital information from the chip. With only 34 pads available to apply and derive signals, the number of logic circuits which may be built on the chip will be severely limited, since there must be at least one input pad for each different input signal applied to the logic circuits and at least one output pad for each signal taken from the logic circuits. For example, one could build on an integrated circuit chip six four-input gates and one three-input gate and thus make use of all of the 34 pads. However, a chip which is 100 mils by 100 mils has enough area for considerably more than these seven gates. However, no more may be built, because of the lack of available pads.

It is not desirable to increase the number of pads on the chip to be able to build more circuits thereon, due to the large area required by each pad (e.g., in the order of 4 mils by 4 mils). Further, there will be associated with each output pad a driver circuit which is approximately the same size as the pad, thus further requiring area of the chip which otherwise could be used to construct logic circuits. Further, the pads will have to be spaced a distance of approximately 3 mils from each other, thus rendering this area of the chip nonusable for logic circuits.

A further disadvantage of having too many pads is that it is difficult and expensive to couple leads from the package containing the chip to each of these pads. One of the major cost factors involved in manufacturing an integrated circuit is attaching the chip to the package, and the major portion of this cost involves attaching the leads of the package to the pads on the chip. Also, where more pads are used, greater chance of failure exists.

It is generally desirable to have an electronic system as small as possible, and thus it is desirable to have the packages containing the integrated circuit chips as small as possible. The major factor in causing a package to be much larger than the chip which it contains is that the number of connecting pins of the package must equal the number of pads on the chip. For instance, a chip 100 mils by 100 mils (0.1 inch by 0.1 inch) which has 40 pads would require a package in the order of one-half inch by 2 inches.

If one could reduce the number of pads for a given number of logic circuits on one chip or increase the size of the chip, and thus the number of logic circuits thereon, without increasing the number of pads, a more compact, less expensive, and more reliable overall integrated circuit could be built. Thus, it is desirable to minimize the number of pads required for a given number of input and output signals applied to or derived from a given integrated circuit chip.

In accordance with a preferred embodiment to this invention, there is provided a periodically operating digital circuit which includes a logic network that provides an output signal in response to an input signal applied thereto where the output signal is logically dependent upon the input signal. There is further included converter means having a plurality of parallel inputs and a plurality of parallel outputs. The converter means, in response to an input signal applied thereto, causes signals to simultaneously appear at selected ones of said outputs during a first portion of each cycle of operation. The converter means, in response to signals applied to selected ones of said converter means parallel inputs during a second portion of each cycle of operation, causes an output signal to be provided thereby. There is further included means for applying to the logic network as the input signal thereof one of the signals caused to appear at the parallel outputs of said converter means. There is additionally included means for applying, during the second portion of each cycle of operation, the output signal provided by the logic network to one of the parallel inputs of the converter means.

Two preferred embodiments of the invention are hereinafter described in detail, reference being made to the following figures, in which.

Figure 1:
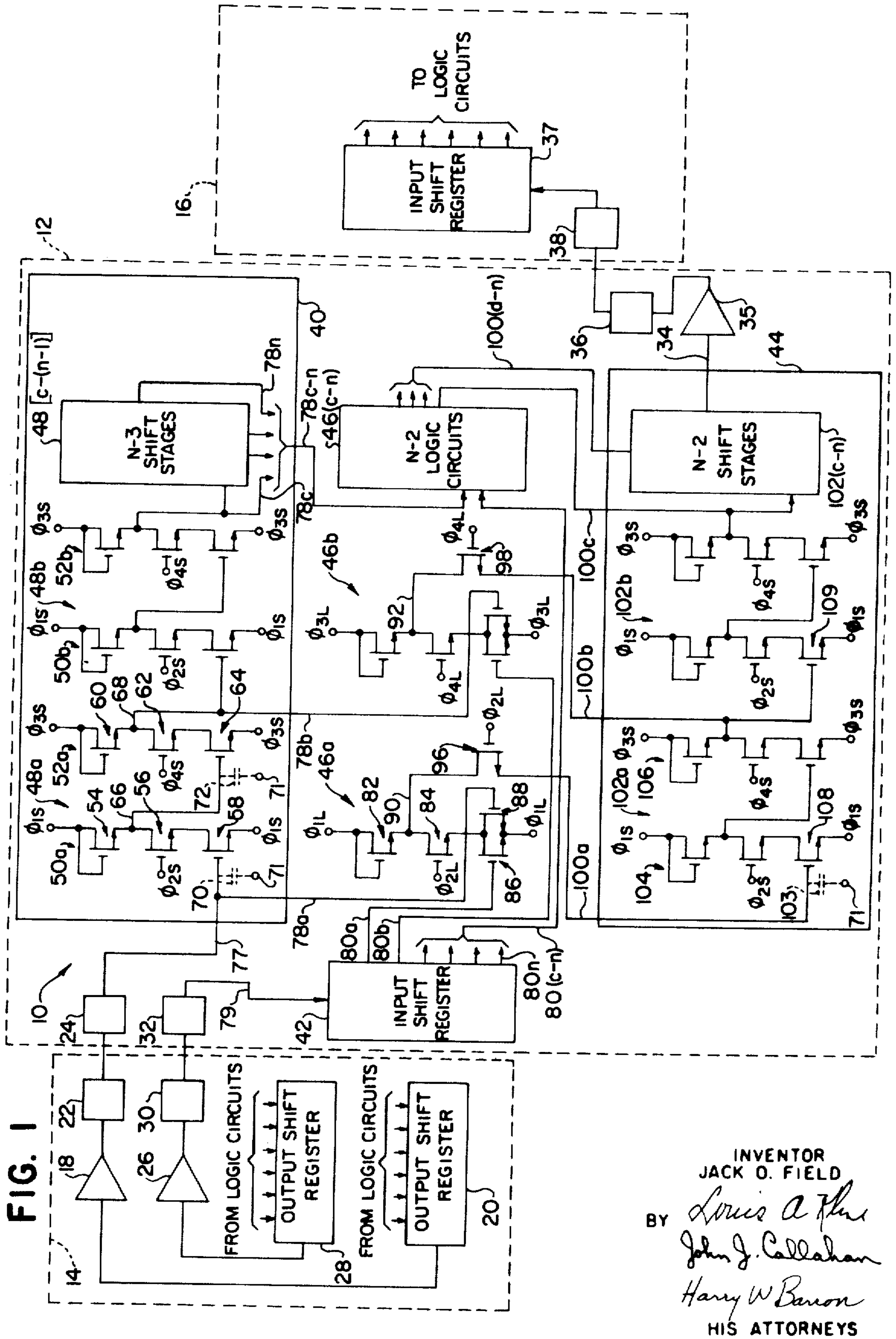
FIG. 1 shows one preferred embodiment of the invention.

Referring now to FIG. 1, there is shown a periodically operating logic circuit 10, which is included as one portion of an integrated circuit chip 12. The integrated circuit chip 12 is just one chip in a larger system which includes integrated circuit chips 14 and 16. A signal is applied from the serial output of a parallel-in, serial-out shift register 20 on the integrated circuit chip 14 through a driver circuit 18 and an output pad 22 of the integrated circuit chip 14, to a medium, such as the package (not shown) of the integrated circuit chip 14 and a printed circuit board (not shown). This signal is thereafter applied to the package (not shown) of the integrated circuit chip 12 and through an input pad 24 and to the circuit 10. In a similar manner, a signal is applied from the serial output of a parallel-in, serial-out output shift register 28 on the integrated circuit chip 14, through a driver circuit 26 and an output pad 30 to the integrated circuit chip 12 at the input pad 32 and to the circuit 10.

The circuit 10, after logically operating on the two signals applied thereto at the input pads 24 and 32 in a manner to be hereinafter described, provides a signal at an output 34, which is applied through a driver circuit 35 and an output pad 36, through the package (not shown) of the integrated circuit chip 12, and back to the medium (not shown) for application to a serial-in, parallel-out input shift register 37 through a pad 38 on the integrated circuit chip 16.

By doing this, one can utilize the input pads 24 and 32 and the output pad and driver combination 35 and 36 to their fullest extent by using each of these elements to receive or provide several different and independent digital signals during each cycle of operation, or, in other words, by time sharing each pad between several input or output signals. In this manner, the area of the integrated circuit chip 12 may be utilize to build the maximum number of independent logic circuits possible, since several input signals may be applied over a single pad or, conversely, several output signals may be derived from a single pad.

In order for the pads in the circuit 10 to be utilized in this manner, there may be constructed on each chip an input shift register for each input pad, such as the two input shift registers 40 and 42, an output shift register for each output pad, such as the output shift register 44, and a plurality of individual logic circuits which are associated with each of these input and output shift registers, such as the logic circuits 46a to 46n. All of the circuits 20, 28, 37, 40, 42. 44, and 46a to 46n are arranged in fouriphase switching circuit configurations. The exact arrangement and operation of a four-phase switching circuit will be described in detail hereinafter.

The input shift registers 37, 40, and 42 are identical in arrangement and operation, and hence only the shift register 40 will be described in detail. The input shift register 40 includes N−1 identical stages 48a to 48n, where N may be any number, such as six. Each stage 48a to 48(*n*−1) is identical and includes two four-phase switching circuits, such as the switching circuits 50a and 52a in stage 48a. Each of the four-phase switching circuits includes three transistors, such as the transistors 54, 56, and 58 in the switching circuit 50a or the transistors 60, 62 and 64 in the switching circuit 52a. Each of the transistors 54, 56, 58, 60, 62, and 64, as well as all other transistors used herein, may be filed effect transistors such as P-channel enhancement-type MOS-transistors. Each of these transistors has a drain electrode, a gate electrode, and a source electrode, respectively designated as the D-, G-, and S-electrodes on the transistor 54. Hereinafter, for each transistor shown in the circuit 10, it will be assumed that the drain electrode is the one of the main electrodes not having an arrow thereon, the source electrode is the one of the main electrodes having an arrow thereon, and the gate electrode is the remaining electrode. The fact that the arrow on the source S-electrode points away from the gate G-electrode indicates that the transistor is P-channel, and the fact that the line connecting the source S- and drain D-electrodes is solid indicates that the transistor is an enhancement type.

The transistors 54, 56, and 58, which form the switching circuit 50a, are connected in a series circuit, so that the source electrode of the transistor 54 is coupled to the drain electrode of the transistor 56, and the source electrode of the transistor 56 is coupled to the drain electrode of the transistor 58. The drain electrode of the transistor 54 and the source electrode of the transistor 58 are each coupled to a signal which is herein designated as the $0_{1s}$ clock signal. The gate electrode of the transistor 54 is coupled to the drain electrode of the transistor 54, and the gate electrode of the transistor 56 is coupled to a signal designated as the $0_{2s}$ clock signal. The gate electrode of the transistor 58 is the input to the switching circuit 50a and thus the input to the first shift register stage 48a, and is coupled to the pad 24; the output 66 of the switching circuit 50a is taken from the junction of the source electrode of the transistor 54 and the drain electrode of the transistor 56.

The transistors 60, 62, and 64, which form the switching circuit 52a, are coupled in a manner similar to the transistors 54, 56, and 58 of the switching circuit 50a. However, in this case a signal designated as the $0_{3s}$ clock signal is applied to the drain electrode of the transistor 60 and the source electrode of the transistor 64, and a signal designated as the $0_{4s}$ clock signal is applied to the gate electrode of the transistor 62. The gate electrode of the transistor 64 is the input of the switching circuit 52a, and is coupled to the output 66 of the switching circuit 50a; the output 68 from the switching circuit 52a is taken from the junction of the source electrode of the transistor 60 and the drain electrode of the transistor 62 and is the output of the first shift register stage 48a.

The switching circuits 50a and 52a are examples of four-phase switching circuits, and the transistors 54 and 60 are respective load transistors thereof, the transistors 56 and 62 are respective isolation transistors thereof, and the transistors 58 and 64 are respective logic transistors thereof. It should be noted that in other types of four-phase switching circuits there may be several logic transistors, as in the case of a multi-input gate, where there would be a logic transistor for each input. The switching circuits 50a and 52a, however, are single-input inverter circuits; hence, only a single logic transistor is required.

A four-phase switching circuit arrangement, such as the switching circuit 50a, where phase 1 ($0_1$)-type and phase 2 ($0_2$)-type clock signals ($0_{1s}$ and $0_{2s}$ in the case of a shift register, and $0_{1L}$ and $0_{2L}$ in the case of a logic circuit such as the circuits 46a to 46n, to be described in detail hereinafter) are applied, is hereinafter referred to as a type I gate. A four-phase switching circuit arrangement similar to the switching circuit 52a to which a phase 3 ($0_3$)-type and a phase 4 ($0_4$)-type clock signals ($0_{3s}$ and $0_{4s}$ in the case of a shift register and and $0_{3L}$ and $0_{4L}$ in the case of the logic circuits) are applied is hereinafter preferred to as a type III gate. In the case of the input shift register 40 and 42 and the output shift register 44, the input to a type I gate must come from the output of a type III gate, and the input to a type III gate must comes from the output of a type I gate. However, this requirement is not necessary for the logic circuits 46a to 46n when the invention herein is used.

It should be noted that there also exist type II and type IV gates which may be operated with four-phase clock signals, and which are arranged in a fashion similar to the switching circuits 50a and 52a except that the isolation and logic transistors are reversed. In a type II gate, a $0_1$-type clock signal is applied to the drain and source electrodes of the respective load and isolation transistors, and a $0_3$-type clock signal is applied to the gate electrode of the isolation transistor; and, in a type IV gate, a $0_3$-type clock signal is applied to the drain and source electrodes of the respective load and isolation transistors, and a $0_1$-type clock signal is applied to the gate electrode of the isolation transistor. A type II gate can only be driven by a type I gate and can only drive a type III gate; a type IV gate can only be driven by a type III gate and can only drive a type I gate. Type II and IV gates may be used for the logic circuits. It should further be noted that one can also use other types of multiphase circuits to practice this invention, such as a two-phase switching circuit configuration which is shown in U.S. Pat. No. 3,406,346, which issued on Oct. 15, 1968, on the application of Frank M. Wanlass and is entitled "Shift Register System."

Figure 2:
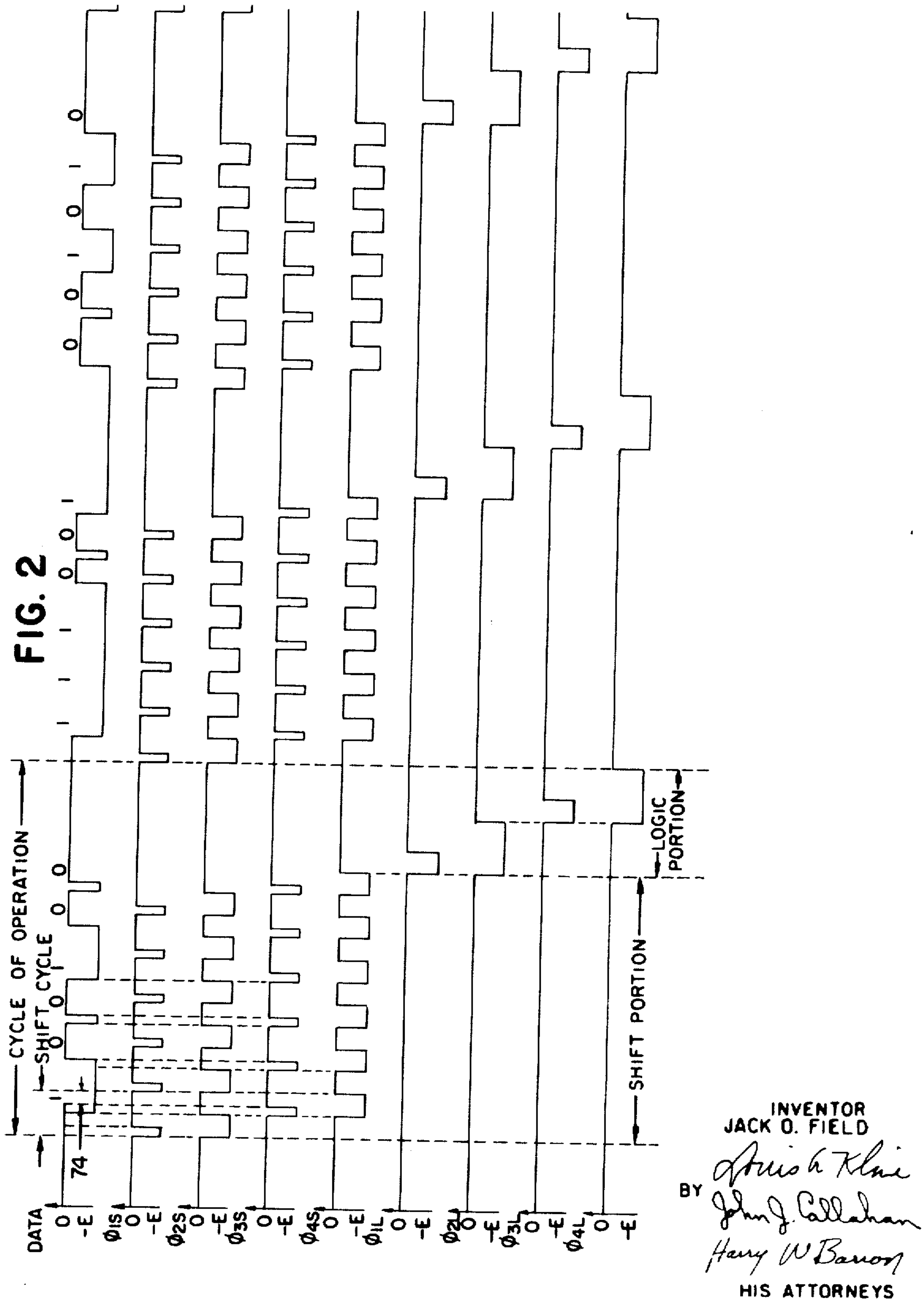
FIG. 2 shows the data signal and a series of clock signals which are used in operating the circuit shown in FIG. 1.

For examples of the $0_1$-type, $0_2$-type, $0_3$-type, and $0_4$-type clock signals, reference is made to FIG. 2 and particularly the waveforms labeled $0_{1s}$, $0_{2s}$, $0_{3s}$, and $0_{4s}$, which show graphic illustrations of $0_{1s}$, $0_{2s}$, $0_{3s}$, and $0_{4s}$ clock signals. It is seen that the pulses of the $0_{1s}$ and $0_{2s}$ clock signals have leading edges which occur at the same time and trailing edges which occur at different times. Similarly, the pulses of the $0_{3s}$ and $0_{4s}$ clock signals have leading edges which occur at the same time and trailing edges which occur at different times. The leading edges of the pulses of the $0_{1s}$ and $0_{2s}$ clock signals occur at the time the trailing edges of the pulses of the $0_{4s}$ clock signal occurred, and the leading edges of the pulses of the $0_{3s}$ and $0_{4s}$ clock signals occur at the time the trailing edges of the pulses of the $0_{2s}$ clock signal occurred. The duty cycle of the $0_{1s}$ and $0_{3s}$ clock signals may be one-sixth, and the duty cycle of the $0_{2s}$ and $0_{4s}$ clock signals may be one-half. The terminology herein used of four-phase switching signals is derived from the fact that the trailing edges of pulses in each of the four clock signals $0_{1s}$, $0_{2s}$, $0_{3s}$, and $0_{4s}$, all occur at different times.

Each of the $0_{1s}$, $0_{2s}$, $0_{3s}$, and $0_{4s}$ clock signals shown in FIG. 2 includes periodic portions of time in which a plurality of pulses periodically occur and other periodic portions of time in which no pulses occur. The number of pulses which occur in each of the first time portions is one less than the number of stages in the input shift registers 40 and 42 and the same as the number of stages in the output shift register 44 and will be shown in FIG. 2 as being six. During the times that the six pulses of the $0_{1s}$, $0_{2s}$, $0_{3s}$, and $0_{4s}$ clock signals are occurring, the input shift registers 40 and 42 and the output shift register 44 are operating to shift information bits in or out, as the case may be. During the time that there are no pulses in the $0_{1s}$, $0_{2s}$, $0_{3s}$, and $0_{4s}$ clock signals, the logic circuits 46a to 46n will be operating to perform the desired logical function.

The term "cycle of operation" is herein used to define the time between the leading edges of the first pulse of each chain of $0_{1s}$ clock pulses. Each cycle of operation will be broken into a "shifting portion" during which time the $0_{1s}$, $0_{2s}$, $0_{3s}$, and $0_{4s}$ pulses occur, and a "logic portion" during which time the $0_{1s}$, $0_{2s}$, $0_{3s}$, and $0_{4s}$ pulses do not occur. As will be clear hereinafter, the pulses of the $0_{1L}$, $0_{2L}$, $0_{3L}$, and $0_{4L}$ clock signals occur during the logic portion. The term "shift cycle" is herein defined to mean the time between the leading edges of any adjacent $0_{1s}$ pulses which occur during the shift portion of each cycle of operation. The frequency of each cycle of operation may be 150 kHz., and the frequency of each shift cycle may be 1.2 MHz.

Reference is now made to the waveform labeled DATA in FIG. 2, which graphically illustrates an example of a DATA-signal which may be applied through the input pads 24 and 32 or derived from the output pad 38. The DATA-signal includes six informational binary bits, which may be either "1" (negative voltage) or "0" (zero or ground voltage) in each cycle of operation. The value of each of these informational bits is determined by the voltage of the DATA-signal during the time between the trailing edge of each $0_3$ clock signal pulse and the trailing edge of each $0_{4s}$ clock signal pulse, such as during the time 74 in FIG. 2, where a "1" bit is shown. It should be noted that the DATA-signal will always have a negative value during the time each $0_{3s}$ clock signal pulse occurs, due to the fact that the input to each stage of each shift register is forced to assume a negative voltage during this time, as will be explained hereinafter. However, since the actual bit is read only during the time 74, this negative portion is meaningless information and can be neglected.

Referring again to FIG. 1 and particularly to stage 48a of the shift register 40, the operation of a four-phase MOS-switching circuit will be described. Because of the unique construction of an MOS-transistor, it has an extremely high input impedance and an inherent capacitance between the gate electrode and the substrate 71 of the chip which can be designed to have a value sufficiently large so that a voltage applied thereto may be stored for a time in excess of several milliseconds. This feature of MOS-transistors can be utilized to build a shift register which can store logic signals until it is desired to apply them to another transistor.

Immediately after the $0_{1s}$ and $0_{2s}$ clock signals become negative (that is, the leading edge occurs), the transistors 54 and 56 are all rendered conductive. This causes a negative voltage to appear at the output 66 of the circuit 50a, and this negative voltage is applied to the gate electrode of the transistor 64. This negative voltage causes a capacitance 72, which is inherent between the gate of the transistor 64 and the substrate 71 of the integrated circuit chip 12, to become charged with a negative voltage; that is, causes it to be charged so that the gate electrode of the transistor 64 is more negative than the substrate 71.

After the trailing edge of the $0_{1s}$ clock signal occurs, the transistor 54 will become cut off and therefore act as an essentially infinite impedance. Since the $0_{2s}$ clock signal is still negative, the transistor 56 will remain conductive. If it is assumed that the first bit of the DATA-signal is a "1" (negative voltage), as seen during the time 74 in FIG. 2, the transistor 58 will be conductive due to the fact that the capacitor 70, which is inherent therewith, is charged negatively; that is, its gate electrode is more negative than the substrate 71. Since the $0_{1s}$ clock signal will have returned to ground, and thus the source electrode of the transistor 58 is at ground, the capacitor 72 of the switching circuit 52a will discharge through the transistors 56 and 58 to ground, and the output 66 will become a zero-volt signal, thus representing a "0" bit. This remains the case after the $0_{2s}$ clock signal returns to ground voltage, because the transistor 56 will become nonconductive, and thus the capacitor 72 will maintain its zero-voltage charge.

If the input signal had been a "0" bit (that is, a zero voltage) when the $0_{1s}$ clock signal returned to ground level, the capacitor 70 would have been charged at zero volts, and thus the transistor 58 would have been nonconductive. In this event, the capacitor 72 would not have been able to discharge through the transistors 56 and 58 to ground, and thus would remain charged with a negative voltage. Thus the signal at the output 66 of the switching circuit 50a would have represented a "1" bit; that is, remained at the negative voltage. This would remain the case after the $0_{4s}$ pulse ended, since the transistor 56 would then become nonconductive. Thus, one can see that the switching circuit 50a acts as an inverter circuit, because, when a "1" bit is applied thereto, a "0" bit is provided at the output 66, and, when a "0" bit is applied thereto, a "1" bit is provided at the output 66.

The circuit 52a is arranged and operates similarly to the circuit 50a except that the clocking signals applied thereto are the $0_{3s}$ and $0_{4s}$ clock signals, and the input signal applied to the gate electrode of the transistor 64 is the signal output 66. At the end of a single-shift cycle, the signal appearing at the output 68 of the switching circuit 52a will be the same as the signal applied to the gate electrode of the transistor 50a, at the beginning of that shift cycle. In this manner, the combination of switching circuits 50a and 52a acts as one stage 48a of the shift register 40.

The circuits 50B and 52B, which are respectively similar to the circuits 50a and 52a, form a second stage 48b of the shift register 40. N−3 stages of the shift register 40 are formed in the same manner in the N−3 shift register stage circuit 48c—(*n* −1). If there is no serial output taken from a shift register, as is the case for the input registers 40 and 42, it is not necessary to provide an Nth stage, even though N bits are applied to the input shift register 40. The Nth bit will merely appear at the output of stage 48(*n*−1). The input signal for each of the stages 48b to 48(*n*−1) is the output signal of the immediately previous stage. For instance, the input signal to stage 48b is the signal at the output 68 of stage **48*l***.

The input shift register is a serial-in, parallel-out shift register and thus has a single serial input 77 and N parallel outputs, 78a to 78n. The serial input 77 is coupled to the input of the first stage 48a and receives the DATA-signal which is applied to the pad 24. Each parallel output 78a to 78(*n*−1) is coupled to the input of the particular shift register stage 48a to 48(*n*−1) with which it is associated; for instance, the parallel output 78a is coupled to the gate of the transistor 58, which is the input of stage 48a. The parallel output 78n is coupled to the output of stage 48(*n*−1).

The input shift register 42 is an N-stage serial-in, parallel-out shift register arranged in a manner similar to the input shift register 40. It has a serial input 79, to which the DATA-signal appearing at the pad 32 is applied, and N parallel outputs 80a to 80n. The input 79 and the outputs 80a to 80n and coupled in the input shift register 42 in the same manner as the input 77 and the outputs 78a to 78n are coupled in the input shift register 40.

Each of the parallel outputs 78a to 78n and 80a to 80n is coupled to at least one of the logic circuits 46a to 46n. For convenience, it is assumed tat the first logic circuit 46a receives the bits provided at the first stage parallel output 78a of the input shift register 40 and the first stage parallel output 80a of the input shift register 42; the second logic circuit 46b receives the bits provided at the second stage parallel output 78b of the input shift register 40 and the second stage parallel output 80b of the shift register 42; and so forth. However, it should be noted that any logic circuit can be responsive to any one or more of the parallel outputs of any input shift register. It is further assumed that each of the logic circuits 46a and 46b is two input NOR gates However, these logic NOR gates. may be any kind of circuit, such as an OR gate, and an AND gate, a NAND gate, a flip-flop, a multivibrator, an inverter, or any other standard or special purpose logic circuit.

The two-input NOR gate of the logic circuit 46a is a type I gate and includes a load transistor 82, an isolation transistor 84, and two logic transistors 86 and 88, all four of which have a drain electrode, a source electrode, and a gate electrode. The source electrode of the transistor 82 is coupled to the drain electrode of the transistor 84, and this coupling is the output 90 of the logic circuit 46a. The source electrode of the transistor 84 is coupled to the drain electrode of each of the transistors 86 and 88, and the source electrodes of each of the transistors 86 and 88 are coupled together. The drain and gate electrodes of the transistor 82 are coupled together and also coupled to the $0_{1L}$ clock signal, and the source electrodes of the transistors 86 and 88 are coupled to the $0_{1L}$ clock signal. The gate electrode of the transistor 84 is coupled to the $0_{1L}$ clock signal. The gate electrode of the transistor 86 is coupled to the parallel output 80*a* of the input shift register 42, and the gate electrode of the transistor 88 is coupled to the parallel output 78*a* of the input shift register 40.

Reference is again made to FIG. 2 and in particular to the waveforms labeled $0_{1L}$, $0_{2L}$, $0_{3L}$, and $0_{4L}$, which graphically show the respective $0_{1L}$, $0_{2L}$, $0_{3L}$, and $0_{4L}$ clock signals. The $0_{1L}$, $0_{2L}$, $0_{3L}$, and $0_{4L}$ clock signals are similar to the respective $0_{1s}$, $0_{2s}$, $0_{3s}$, and $0_{4s}$ clock signals shown in FIG. 2 except that they have only a single pulse during each cycle of operation and that this pulse is of a longer duration than is the corresponding $0_{1s}$, $0_{2s}$, $0_{3s}$, and $0_{4s}$ pulse. That portion of the cycle of operation during which at least one of the $0_{1L}$, $0_{2L}$, $0_{3L}$, and $0_{4L}$ pulses exists is the logic portion of each cycle of operation.

During the logic portion of each cycle of operation, the logic circuits 46*a* to 46*n* operate in a manner similar to that described above with respect to the switching circuits 50*a* and 52*a*. In the case of the logic circuit 46*a*, the output signal appearing as the output 90 will be a "1" bit (negative voltage) only if the signals applied to the gate electrodes of both transistors 86 and 88 from the respective parallel outputs 80*a* and 78*a* are both "0" bits (zero voltage); otherwise it will be a "0" bit. This is because the capacitance associated with the gate of the transistor to which the signal at the output 90 is applied will be able to discharge through either or both transistors 86 and 88 during the time the $0_{2L}$ clock signal is negative and the $0_{1L}$ clock signal is zero. Thus, the logic circuit 46*a* acts as a two-input NOR gate, and, since the $0_{1L}$ and $0_{2L}$ signals are applied thereto, it is a type I two-input NOR gate.

The logic circuit 46*b* operates similarly to the logic circuit 46*a* and applies the signal to an output 92 in response to the two signals applied thereto from the parallel outputs 78*b* and 80*b*. Since the logic circuit 46*b* is responsive to the $0_{3L}$ and $0_{4L}$ clock signals, it is a type III two-input NOR gate. The remaining logic circuits 46*c* to 46*n* each provide output signals in response to signals applied thereto from the parallel outputs 78*c* to 78*n* and 80*c* to 80*n* of the input shift registers 40 and 42.

Each of the logic circuit 46*a* to 46*n* outputs, such as the outputs 90 and 92, is applied through switches, such as the source-to-drain path of transistors 96 and 98, to one parallel input 100*a* to 100*n* of the output shift register 44. Each switch transistor, such as 96 and 98, is gated to be conductive during the time when the particular logic circuit 46*a* to 46*n* with which it is associated is providing an output signal; otherwise it is gated to be nonconductive. Thus, in the case of the transistor 96, its gate electrode is coupled to the $0_{2L}$ clock signal, and, in the case of the transistor 98, its gate electrode is coupled to the $0_{4L}$ clock signal.

The output shift register 44 is a parallel-in, serial-out shift register and includes N stages 102*a* to 102*n*, each of which is similar to stage 48*a* of the input shift register 40, discussed above. Each stage includes two switching circuits, such as 104 and 106 in the first stage 102*a*, and the input of each of the stages 102*a* to 102*n* is the gage electrode of the logic transistor in the first switching circuit of that stage. For instance, the input to the stage 102*a* is applied to the gate electrode of a transistor 108. The input to each stage 102*a* to 102*n* is coupled to a respective one of the inputs 100*a* to 100*n* of the logic circuits 46*a* to 46*n*, which thereby form the parallel inputs, and, further, in the case of stages 102*b* to 102*n*, the input to each stage is coupled to the output of the preceding stage. For instance, the input of stage 102*b* is the gate electrode of a transistor 109, which is coupled to the output of the circuit 106 and also to input 100*b*. The output of the Nth stage 102*n* is the serial output 34 of the output shift register 44 and is coupled to the driver circuit 35.

The operation of the circuit 10 will now be explained during one cycle of operation, beginning with the start of the shift portion of that one cycle of operation. It will be assumed that, during the previous cycle of operation, the logic circuits 46*a* to 46*n* had provided bits to the parallel inputs 100*a* to 100*n* and that these bits are now stored in the output shift register 44 and are to be provided in serial order to the pad 38 on the integrated circuit chip 16 as the DATA-signal for that chip during the one cycle of operation now being considered. It is further assumed that the shift registers 20 and 28 on the integrated circuit chip 14 have N bits stored therein which were applied thereto from logic circuits (not shown) on that chip and which are to be serially applied through the pads 24 and 32 as the DATA-signal during the one cycle of operation being considered. It should be noted that the DATA-signal bits which were applied to the logic circuits 46*a* to 46*n* during the previous cycle of operation are still stored in the input shift registers 40 and 42.

During the time the first $0_{1s}$ and $0_{2s}$ pulses occur, the bits stored at the inputs to each stage of each shift register 20, 28, 37, 40, and 44 are each inverted and moved one-half stage up. For instance, if a "1" bit had been stored in the capacitor 70 of stage 48*a* in the input shift register 40 prior to the $0_{1s}$ pulse, a "0" bit will be stored in the capacitor 72 of stage 48*a* in the input shift register 40 after the first $0_{1s}$ and $0_{2s}$ pulses are completed. When the first $0_{3s}$ and $0_{4s}$ pulses occur, the capacitance inherent with the input to each stage will charge up to a negative voltage (hence the negative portion during each $0_{3s}$ pulse in the DATA-signal), signal), and, during the time between the trailing edges of the $0_{3s}$ and $0_{4s}$ pulses, this capacitance will assume a voltage which is opposite to the voltage stored in the second switching circuit of the previous stage, or, in other words, at the end of the first shift cycle, the bit which is stored at the input of each stage will be the same as the bit stored at the input of the previous stage at the beginning of the first shift cycle. In the case of the last stage of the input shift registers 37, 40, and 42, the bit stored therein will cease to exist, and, in the case of the last stage of the output shift registers 20, 28, and 44, the bit stored therein at the beginning of the shift cycle will be applied to the serial input of an input shift on the next integrated circuit chip as the Nth bit of the DATA-signal applied thereto. This bit is referred to herein as the Nth bit because it eventually will appear at the Nth output 78*n* of the input shift register 40.

During the second shift cycle, each bit is again shifted one stage up, and a second bit is applied to the input shift registers 37, 40, and 42 by the respective output shift registers 44, 20, and 28. Thus, at the end of the second shift cycle, the bits which are eventually to go into the (Nth−1) and the Nth stages are respectively stored in the first and second stages of each input shift register 37, 40, and 42.

This procedure is continued for N shift cycles, so that, at the end of the shift portion, the first bit of the DATA-signal is stored in the first stage of each input shift register, the second bit in the second stage, and so forth. It should be noted that, at the end of the shift portion, the bits originally stored in the output shift registers will have been shifted to an input shift register on another chip and that no meaningful information will be stored in the output shift registers.

After the shift portion of the cycle of operation is completed, the logic portion begins. Each of the logic circuits 46*a* to 46*n* provides an output signal in response to the bits stored in the input shift registers 40 and 42. These output signals are applied to the parallel input 100*a* to 100*n* of the proper stages of output shift register 44 and stored in the capacitance associated therewith. Thus, at the end of the logic portion of the cycle of operation, the logical operations have been performed, and the results thereof are stored in output shift registers.

During the next cycle of operation, the bits stored in output shift registers are shifted out and applied to an input shift register on another chip, and these bits will then be the input signals to the logic circuits (not shown) on that other chip during this next cycle of operation. Thus, each bit is continuously applied from a logic circuit to an output shift register, shifted out of the output shift register and into an input shift register, and applied to another logic circuit.

It should be understood that, although only two input shift registers 40 and 42 are shown on the integrated circuit chip 12, in practice there may be several such input shift registers, each of which applies a bit to the logic circuits **46*a* to 46*n* or to any other logic circuits on the chip. This would be the case, for instance, where a logic circuit, such as 46*a*, was a sophisticated multi-input logic circuit. Each of the several inputs to that circuit would come from a different parallel output. The exact number of the input shift registers is determined by the number of different signals required on the chip divided by the capacity of each input shift register. There could be several output shift registers similar to the output shift registers 44 if the number of logic circuits on the integrated circuit chip 12** were greater than the number of stages N in one output shift register. The number of the output shift registers required is determined by the number of logic circuits on the chip and the capacity of each of the output shift registers. It should further be understood that, once a bit is applied from an input shift register to a logic circuit, it is not necessary that it be then applied to an output shift register in that same cycle of operation. It is possible to apply it through several logic circuits on the same chip during several cycles of operation, before eventually applying it to an output shift register.

By using this invention, one can greatly increase the number of logic circuits which can be built on a given chip without having to increase the number of pads correspondingly. For example, where a chip contains 40 pads, 8 pads will be necessary for the $0_{1s}$, $0_{2s}$, $0_{3s}$, $0_{4s}$, $0_{1L}$, $0_{2L}$, $0_{3L}$, and $0_{4L}$ clock signals and two pads for the power supply voltages, leaving 30 pads usable for data signals. One could build 36 four-input gates on a chip if one provided 24 input shift registers and six output shift registers, each having a capacity of six bits. This should be compared with the prior art example given above, in which one could build only six four-input gates and one three-input gate. It should be noted that this number of logic circuits can still be increased either by using two-phase shift registers or by generating some of the clock signals on the chip, thereby being able to utilize some of the clock signal pads for information signals.

Figure 3:
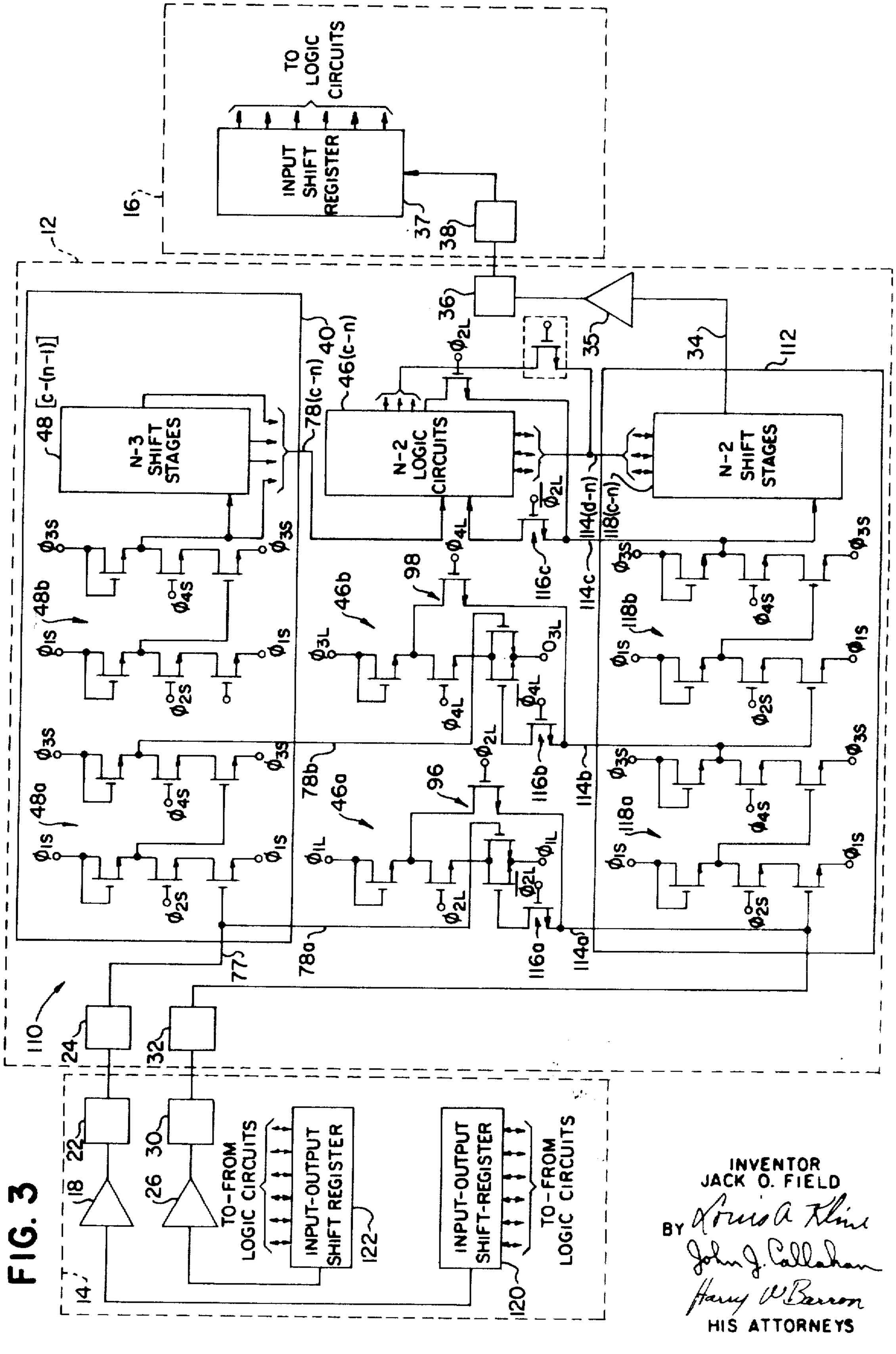
FIG. 3 shows a second preferred embodiment of the invention.

Reference is now made to FIG. 3, where a second preferred embodiment of the invention is shown, which utilizes a serial-in, serial-out, parallel-in, parallel-out shift register as both an input shift register and an output shift register. This second embodiment has the advantage over the first embodiment in that one input shift register may be eliminated at the expense of a single transistor in each logic circuit. FIG. 3 shows the circuit 110, in which like numerical designations are given to the circuits or components which are similar to those shown in FIG. 1. It will be assumed that these components function in the same manner as their counterparts in FIG. 1, and hence a duplicate description will not be given.

The circuit 110 includes an input shift register 40 and a plurality of logic circuits **46*a* to 46*n* and an input-output shift register 112, which replaces the input shift register 42 and the output shift register 44. The input-output shift register 112 is similar to the output shift register 44 shown in FIG. 1, except that is receives the serial DATA-signal from the pad 32 as well as the parallel output signals from the logic circuits 46*a* to 46*n*. In response to the DATA-signal, the input-output shift register 112 provides signals at each of its N parallel input-outputs 114*a* to 114*n*, and each of these signals is applied to one input of one of the logic circuits 46*a* to 46*n*. The signals appearing at each of the input-outputs 114*a* to 114*n* of the input-output shift register 112 are applied through a respective switch transistor 116*a* to 116*n* to one of the logic circuits 46*a* to 46*n*. These switch transistors 116*a* to 116*n* are made nonconductive only during the time the particular logic circuit with which they are associated is operating. For example, since the logic circuit 46*a* is a type I NOR gate, the switch transistor 116*a* is gated conductive during the time the $0_{2L}$ clock signal is at ground voltage, or, in other words, by the $\overline{0_{2L}}$ clock signal. This $\overline{0_{2L}}$ clock signal can be obtained by merely inverting the $0_{2L}$ clock signal. Similarly, the switch transistor 116*b*** is gated conductive by the $\overline{0_{4L}}$ clock signal.

The operation of the circuit in FIG. 3 is as follows. DATA-signals are applied to the pads 24 and 32, and, during the shift portion of each cycle of operation, the bits of the DATA-signal are shifted into the shift registers 40 and 112, so that at the end of the shift portion of the cycle of operation there is a bit at each parallel output **78*a* to 78*n* and each parallel input-output 114*a* to 114*n*. During the shift portion of the cycle of operation, the gates 116*a* to 116*n* are conductive, so thus the desired signals will have been applied to and stored at the gate electrodes of the logic transistors of each of the logic circuits 46*a* to 46*n***.

During the logic portion of each cycle of operation, the gates **116*a* to 116*n* are rendered nonconductive, the gates 96 and 98 are rendered conductive, and the logic circuits 46*a* to 46*n* perform their logical operation and apply output signals back to the input-outputs 114*a* to 114*n* as explained above. These signals applied to the input-outputs 114*a* 114*n* are then stored in the input-output shift register 112. The bits previously stored in the input-output shift register 112 are destroyed when the $0_{1L}$ or $0_{3L}$ pulses occur, because the capacitor inherent with the input to each stage is charged to a negative voltage. However, this is of no concern, because the bits have already been locked in at the logic circuit inputs by the closing of the switch transistors 116*a* to 116*n***.

During the shift portion of the next cycle of operation, these new bit which are stored in the input-output shift register 112 are applied as output signals to the pad 36, as was the case with the output shift register 44 shown in FIG. 1. Also during this time, the DATA-signal for the next cycle of operation will be applied to the input-output register 112. However, before a bit arrives at the first stage **118*a* of the input-output shift register 112, the bit previously stored in that stage will have been shifted to stage 118*b*. Thus, as an output signal is being shifted out, an input signal is being shifted in, thereby fully utilizing the capacities of the input-output shift register 112**.

It should be noted with respect to FIG. 3 that the output shift registers 20 and 28 on the chip 14 have also been replace by the input-output shift registers 120 and 122.

What is claimed is:

1. A periodically operating digital circuit comprising:

at least one logic network which provides an output signal in response to an input signal applied thereto, said output signal being logically dependent upon said input signal;

converter means having a plurality of parallel inputs and a plurality of parallel outputs responsive to an input signal applied thereto for causing, during a first portion of each cycle of operation, signals to simultaneously appear at selected ones of said parallel outputs, and said converter means, in response to signals applied to selected ones of said parallel inputs thereof during a second portion of each cycle of operation, causing an output signal to be provided thereby;

means for applying to said logic network, as said input signal thereof, one of the signals caused to appear at said parallel outputs of said converter means; and means for applying during said second portion of each cycle of operation said output signal provided by said logic network to one of said parallel inputs of said converter means.

2. The invention according to claim 1 wherein said converter means includes means for providing said output signal during the first portion of the cycle of operation immediately following the cycle of operation in which said signals, to which said output signal is in response, are applied to said selected parallel inputs.

3. The invention according to claim 1 wherein said converter means includes a shift register having a serial input, a serial output, and a plurality of parallel input-outputs, said converter means input signal being applied to said serial input of said shift register and including a plurality of informational bit signals which occur one after another in serial order during said first portion of each cycle of operation, said shift register causing a signal corresponding to a different one of each of said bits applied to said serial input thereof to appear simultaneously and in parallel at a predetermined one of each of said input-outputs at the end of said first portion of each cycle of operation, one of said signals caused to appear at said input-outputs being the signal applied to said logic network, said one signal caused to appear at said input-outputs being replaced by the signal provided by said logic network during said second portion of said cycle of operation, said shift register causing said signals which appear at each of said input-outputs at the end of said second portion of each cycle of operation to be thereafter applied, one after another in serial order, at said serial output thereof as said converter means output signal.

4. The invention according to claim 3 wherein said converter means includes means for providing said output signal during the first portion of the cycle of operation immediately following the cycle of operation during which said one signal is caused to appear at said input-outputs of said shift register.

5. The invention according to claim 1 wherein said converter means includes an input shift register and an output shift register, said input shift register having a serial input and a plurality of parallel outputs and said output shift register having a plurality of parallel inputs and a serial output, said converter means input signal being applied to said serial input of said input shift register and including a plurality of informational bit signals which occur one after another in serial order during the first portion of each cycle of operation, said input shift register causing a signal corresponding to a different one of each said bits applied to said serial input thereof to appear simultaneously and in parallel order at a predetermined one of each of said parallel outputs thereof at the end of said first portion of each cycle of operation; one of said signals appearing at said parallel outputs of said input shift register being the signal applied to said logic network, said output signal provided by said logic network being applied to one of said parallel inputs of said output shift register, said output shift register causing all of the signals which are applied to said parallel inputs thereof to be thereafter applied, one after another in serial order, at said serial output thereof as said converter means output signal.

6. The invention according to claim 5 wherein said converter means includes means for providing said output signal during the first portion of the cycle of operation immediately following the cycle of operation during which said one signal is caused to appear at one of said parallel outputs of said input shift register.

7. In combination:

a shift register having at least two stages, there being a given bit of information in a given one of said stages;

logic means remote from said shift register responsive to the application thereto of said given bit of information for providing a new logically different bit of information which is a logical function of said given bit of information; and means coupling said logic means to said given stage for causing said given bit of information to be replaced by said new bit of information;

said shift register thereafter causing said new bit of information to be shifted to a new stage.

8. The invention according to claim 7 in which said shift register includes in each stage thereof semiconductor devices which can store a signal for a time longer than the time necessary to shift a bit from one stage to the next succeeding stage of said shift register, and which can allow a signal which is stored thereby to be replaced by a new signal which is to be stored thereby in a time less than the time necessary to shift a bit from one stage to the next succeeding stage of said shift register, said stored signals representing bits of information.

9. The invention according to claim 7 in which said shift register includes field effect transistors arranged in a multiphase switching circuit configuration.

10. The invention according to claim 7:

wherein said new bit providing means includes means for storing a signal corresponding to said given bit for a time at least as long as the time required to provide said new bit;

wherein said shift register includes means to store a signal corresponding to a bit of informations; and wherein means are further included for allowing the signal stored in said shift register which corresponds to said given bit to assume a given value value prior to the time said new bit is provided.

11. The invention according to claim 10 wherein said means for allowing further includes means for causing said signal stored in said shift register to assume a value corresponding to said new bit after it has assumed said given value.

12. The invention according to claim 7 in which said given stage of said shift register is located on one integrated circuit chip and said new stage is located on another integrated circuit chip.

13. In combination:

a shift register having at least two stages, there being a given bit of information in a given one of said stages;

means for shifting said given bit of information from one of said stages to another one of said stages during a first portion of each cycle of operation; and logic means remote from said shift register for causing said given bit of information to be replaced by a new logically different bit of information during a different unique second portion of said cycle, said new bit of information being logically dependent upon said given bit of information.

14. The invention according to claim 13 wherein said means for shifting further includes means for causing said new bit of information to be shifted to a third stage of said shift register during a first portion of the next cycle of operation and thereafter replaced with a third bit of information during a second portion of said next cycle, said third bit of information being logically dependent upon said new bit of information.

15. The invention according to claim 14 in which said shift register includes field effect transistors arranged in a multiphase switching circuit configuration.

16. The invention according to claim 14:

wherein said logic means includes means for storing a signal corresponding to said given bit for a time at least as long as the time required to provide a signal which corresponds to said new bit;

wherein said shift register includes means to store a signal corresponding to a bit of information; and wherein means are further included for allowing the signal stored in said shift register which corresponds to said given bit to assume a given value prior to the time said given bit is replaced.

17. The invention according to claim 16 wherein said signal stored in said shift register is caused to assume a value corresponding to said new bit after it has assumed said given value.

18. The invention according to claim 13 in which said one stage of said shift register is located on one integrated circuit chip and said another stage of said shift register is located on a second integrated circuit chip.

19. The invention according to claim 13 wherein said logic means includes a logic circuit which in response to a signal applied thereto provides a signal which is logically dependent upon said signal so applied, first coupling means for coupling the signal appearing at said another stage of said shift register to said logic circuit only during said first portion of said cycle, and second coupling means for coupling said signal provided by said logic circuit to said another stage of said shift register only during said second portion of said cycle.

20. On an integrated circuit chip which includes a plurality of periodically operating logic circuits each of which during each cycle of operation performs a logical operation and provides an output signal which is in accordance with the logical operation so performed; and at least one output means which includes an output pad; circuitry included on said chip for translating said output signals to said output means comprising:

a converter having an output and a plurality of inputs for converting a plurality of signals which are applied in parallel to said inputs thereof to a single signal which manifests each of said parallel applied signals in a predetermined serial order;

first coupling means for causing each of said logic circuit output signals to be applied to a respective one of said converter inputs; and second coupling means for coupling said converter signal output to said output means;

said logic circuits operating during a first portion of said cycle and said converter operating during a second portion of said cycle.

21. The invention according to claim 20 wherein said first coupling means causes said logic circuit output signals to be applied to said converter during said first portion of said cycle.

22. The invention according to claim 20 further including clocking means for providing two sets of periodic clock signals, each signal of said first set of clock signals having a single uniquely defined pulse which can only occur during said first portion of said cycle and each signal of said second set of clock signals having a plurality of uniquely defined periodic pulses which can only occur during said second portion of said cycle, said first set of clock signals being applied to said logic circuits and said second set of clock signals being applied to said converter.

23. The invention according to claim 22:

wherein said two sets of clock signals are multiphase switching circuit signals;

wherein said logic circuits include multiphase switching circuits arranged to perform logical operations; and wherein said converter includes multiphase switching circuits arranged as a serial-in, parallel-out shift register.

24. A circuit for performing a plurality of logical operations during a first given time in a cycle and for transferring the results of each of said logical operations so performed to an output during a second given time, in said cycle, said circuit comprising:

means for providing two sets of clock signals during said cycle, said first set including four signals, each of which has one uniquely defined pulse during said first given time in each cycle and said second set including four signals, each of which has one chain of uniquely defined pulses during said second given time in each cycle, the pulses of said second set of signals occurring after the pulses of said first set of signals have occurred;

a plurality of logic networks each of which in response to an input signal and in response to two of said four signals of said first set of clock signals provides an output signal which is a logical function of said input signal, a parallel-in, serial-out shift register having a plurality of inputs and a single output, said logic network output signals being applied in parallel to said inputs of said shift register during said first given time and said shift register providing a signal at its output during said second given time, said shift register output signal being a serial version of said logic network output signals; and means for coupling the output of said shift register to the output of said circuit.

25. On an integrated circuit chip which includes input means to which an input signal is applied and a plurality of logic circuits each of which during a first given time and in response to a signal applied to an input thereof provides a signal at an output thereof which is a logical function of said signal applied thereto, said input signal including a plurality of individual signals arranged in a serial order, circuitry for causing each of said plurality of individual signals to be applied to a respective one of said plurality of logic circuits, said circuitry comprising:

a converter having an input and a plurality of outputs, said input being coupled to said input means such that said input signal is applied to said converter input, and responsive to a timing signal associated therewith at the end of a second given time, which occurs prior to said first given time period, for causing a different one of said individual signals to be provided at a respective one of said converter outputs; and means for coupling each of said converter outputs to a respective one of said logic circuits.

26. The invention according to claim 25 further including clocking means which provide two sets of periodic clock signals, the period of each signal in each set of said clock signals being identical and equal to said first given time plus said second given time, each signal of said first set of clock signals having a fixed number of pulses which can occur only during said first time, said fixed number depending upon the number of individual signals included in said input signal, and each signal of said second set of clock pulses having at least one pulse which can occur only during said second time, said first set of clock signals being applied to said converting means as said control signal associated therewith and said second set of control signals being applied to said logic circuits to cause said logic circuits to provide said output signals.

27. The invention according to claim 26 wherein said two sets of clock signals are multiphase switching circuits signals, wherein said logic circuits are multiphase logic circuits; and wherein said converter is a multiphase serial-in, parallel-out shift register.

28. Circuitry on an integrated circuit chip for performing M logical operations during each cycle of operation in response to the application to said circuitry through a single pad on said integrated circuit chip of an input signal which includes a plurality of serially arranged periodic bit chains, each of said bit chains including N serially arranged bits of information, all of which occur during a first portion of each cycle of operation, at least one of said logical operations during each cycle being in response to at least one of said bits of information in the chain of N bits of information occurring in that cycle, said logical operations occurring during a second portion of each cycle, said circuitry comprising:

means for providing first and second sets of periodic four-phase switching circuit clock signals, each signal of said first set of clock signals having during each cycle at least N pulses all of which occur only during said first portion of said cycle and each signal of said second set of clock signals having during each cycle a single pulse which occurs only during said second portion of said cycle;

a serial-in, parallel-out, four-phase controlled shift register having at least N stages, said input signal being applied to a serial input of said shift register, said first set of clock pulses being applied to clocking inputs of said shift register, and each of said N bits of information appearing at one given one of at least N parallel outputs of said shift register after the last pulse of said first set of clock signals has occurred; and M logic circuits to each of which information signals are applied, at least one of said information signals which is applied to at least one of said logic circuits being the signal appearing at one of said N parallel outputs of said shift register and to each of which at least two of the signals of said second set of clocking signals are applied, each of said logic circuits providing an output signal during said second portion of said cycle, said signal being a logical function of the information signals applied thereto.

29. Circuitry on an integrated circuit chip for performing M logical operations during each cycle of operation in response to the application to said circuitry through an input pad on said integrated circuit chip of an input signal which includes a plurality of serially arranged periodic bit chains, each of said bit chains including N serially arranged bits of information all of which occur during a first portion of each cycle of operation, at least one of said logical operations during each cycle being in response to at least one of said bits of information in the chain of N bits of information occurring in that cycle, said logical operations occuring during a second portion of each cycle, said circuitry further providing an output signal during the first portion of said cycle which includes a chain of N bits of information, at least one of said N bits of information of said output signal corresponding to the signal resulting from a logical operation performed during a prior cycle of operation, said circuitry comprising:

means for providing first and second sets of phased switching clock signals, each signal of said first set of clock signals having during each cycle at least N pulses all of which occur only during said first portion of said cycle and each signal of said second set of clock signals having during each cycle a signal pulse which occurs only during said second portion of said cycle, means for applying said first set of clock signals and said input signal to a shift register, said shift register causing each one of said N bits of information which occur during each cycle to appear at a respective one of N outputs of said shift register after the last pulse of said first set of clock signals has occurred, during that cycle;

M logic circuit responsive to the application of said signals appearing at each of said N outputs of said shift register for providing at an output thereof signal which is a logical function of said signals so applied, said logic circuits providing said signals during said second portion of each cycle;

means for coupling the output of at least one of said logic circuits to one of N parallel inputs of a shift register, whereby said one logic circuit output signal is stored in said shift register having said N parallel inputs;

said shift register having said N parallel inputs providing a serial output there of a chain of bits, during the first portion of said next cycle of operation, one of said bits representing said signal from said one logic circuit.

* * * * *